(12) United States Patent
Sane et al.

(10) Patent No.: US 9,659,899 B2
(45) Date of Patent: May 23, 2017

(54) DIE WARPAGE CONTROL FOR THIN DIE ASSEMBLY

(71) Applicant: INTEL CORPORATION, Santa Clara, CA (US)

(72) Inventors: Sandeep B. Sane, Chandler, AZ (US); Shankar Ganapathysubramanian, San Jose, CA (US); Jorge Sanchez, Phoenix, AZ (US); Leonel R. Arana, Phoenix, AZ (US); Eric J. Li, Chandler, AZ (US); Nitin A. Deshpande, Chandler, AZ (US); Jiraporn Seangatith, Chandler, AZ (US); Poh Chieh Benny Poon, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/796,759

(22) Filed: Jul. 10, 2015

(65) Prior Publication Data

US 2015/0318258 A1 Nov. 5, 2015

Related U.S. Application Data

(62) Division of application No. 13/631,612, filed on Sep. 28, 2012, now Pat. No. 9,123,732.

(51) Int. Cl.
*H01L 23/48* (2006.01)
*H01L 23/52* (2006.01)
(Continued)

(52) U.S. Cl.
CPC ............ *H01L 24/32* (2013.01); *H01L 23/562* (2013.01); *H01L 24/81* (2013.01); *H01L 24/89* (2013.01); *H01L 24/13* (2013.01); *H01L 24/16* (2013.01); *H01L 2224/131* (2013.01); *H01L 2224/16225* (2013.01); *H01L 2224/16227* (2013.01); *H01L 2224/3213* (2013.01); *H01L 2224/32225* (2013.01); *H01L 2224/32501* (2013.01); *H01L 2224/32505* (2013.01); *H01L 2224/81007* (2013.01); *H01L 2224/81193* (2013.01); *H01L 2224/81815* (2013.01);
(Continued)

(58) Field of Classification Search
CPC ....... H01L 2224/32225; H01L 23/3735; H01L 23/15
See application file for complete search history.

(56) References Cited

U.S. PATENT DOCUMENTS

2005/0194670 A1* 9/2005 Kameyama ....... H01L 21/76898
257/678
2005/0275108 A1* 12/2005 Saiki .................... H01L 21/768
257/758

(Continued)

*Primary Examiner* — John M Parker
(74) *Attorney, Agent, or Firm* — Blakely, Sokoloff, Taylor & Zafman LLP

(57) ABSTRACT

Die warpage is controlled for the assembly of thin dies. In one example, a semiconductor die has a back side and a front side opposite the back side. The back side has a semiconductor substrate and the front side has components formed over the semiconductor substrate in front side layers. A backside layer is formed over the backside of the semiconductor die to resist warpage of the die when the die is heated and a plurality of contacts are formed on the front side of the die to attach to a substrate.

20 Claims, 3 Drawing Sheets

(51) Int. Cl.
*H01L 29/40* (2006.01)
*H01L 23/00* (2006.01)

(52) U.S. Cl.
CPC ............... *H01L 2924/10253* (2013.01); *H01L 2924/12042* (2013.01); *H01L 2924/15311* (2013.01); *H01L 2924/161* (2013.01); *H01L 2924/3511* (2013.01)

(56) References Cited

U.S. PATENT DOCUMENTS

| | | | | |
|---|---|---|---|---|
| 2009/0079049 | A1* | 3/2009 | Do | H01L 21/568 257/676 |
| 2009/0218686 | A1* | 9/2009 | Saitou | H01L 23/3114 257/737 |
| 2009/0250251 | A1* | 10/2009 | Shibata | H01L 21/4832 174/255 |
| 2011/0127669 | A1* | 6/2011 | Mizuhara | B23K 1/0016 257/737 |

* cited by examiner

DIE WARPAGE CONTROL FOR THIN DIE ASSEMBLY

CROSS-REFERENCE TO RELATED APPLICATIONS

The present application is a divisional of prior-filed U.S. patent application Ser. No. 13/631,612 filed Sep. 28, 2012, entitled Die Warpage Control for Thin Die Assembly, by Sandeeep B. Sane et al., issued as U.S. Pat. No. 9,123,732 on Sep. 1, 2015 and assigned to the assignee of the present application, the priority of which is hereby claimed.

FIELD

The present disclosure pertains to the field of die packaging and, in particular, to applying a layer to a die to resist warpage.

BACKGROUND

The electronics market constantly strives to produce products that are thinner and lighter than ever before. The trend is particularly seen in smart phones, tablets, and the new thin and light and ultrabook notebook computers. While recent products have thinner and lighter physical cases, cooling systems, and power supplies, there is also a demand to make the internal components thinner and lighter as well.

However, it is difficult to make integrated circuits and integrated circuit packages thinner and lighter without adverse effects. Integrated circuits require some thickness for strength against external pressure. In addition integrated circuits require some thickness in order to survive temperature variations that are experienced during fabrication and use.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

For future thin and light products such as displays, tablets, portable devices, smart phones and computers an extremely thin silicon and extremely thin silicon substrate are desired in order to reduce the overall height of the package containing the silicon. To attach a die to a package, the die is placed over solder balls on a package substrate. The die and substrate are placed in a reflow oven to melt the solder and establish an electrical connection between lands on the die and lands on the substrate through the solder. As the die heats in the reflow furnace it can warp. The warpage is caused by differences in the coefficient of thermal expansion (CTE) between the silicon substrate of the die and the front end layers of oxides, doped silicon, and other materials that have been formed on the die to make it an integrated circuit. The front end layers are the transistors, resistors, diodes, capacitors, and other components of the integrated circuit.

Figure 1:
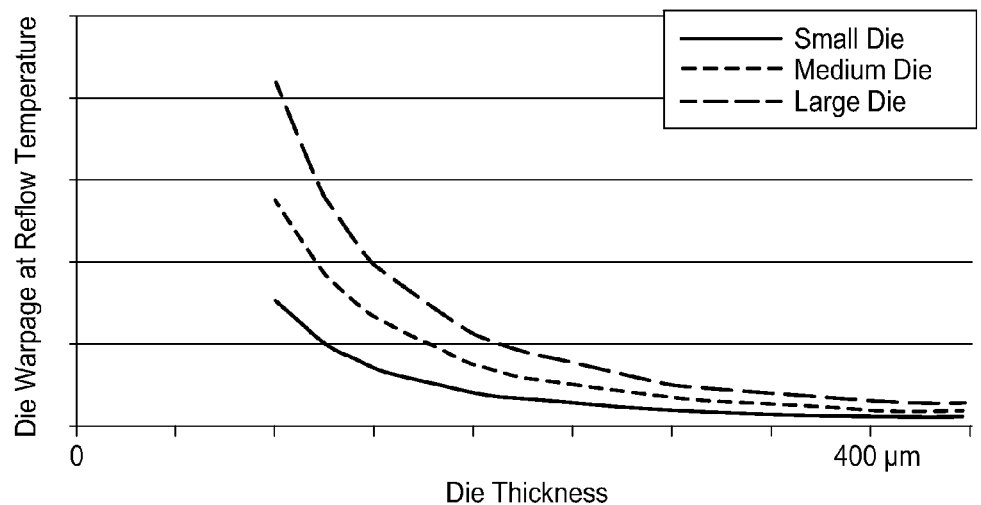
FIG. 1 is a graphical diagram of die warpage as a function of die thickness.

With a thick die substrate, e.g. 800 μm, the warpage is mechanically resisted by the thick silicon substrate of the die. As the substrate is made thinner it is less able to resist warpage. The silicon warpage is extremely high at chip attach temperatures as the die is thinned down to 400 μm and below. FIG. 1 is a graphical diagram of die warpage on the vertical axis measured at chip attach or solder reflow temperatures as a function of die thickness on the horizontal axis starting at 400 μm. As shown, warpage increases significantly as the die is made thinner. Warpage is also greater for larger dies. In addition with more front side layers, warpage is also increased.

Die warpage reduces the reliability of the connection between the die and the package substrate. To achieve a successful chip attach for a thin die, the die needs to remain as flat as possible. In some applications, a warpage of more than 15 μm will prevent a reliable connection, however, the particular requirements will vary for different implementations. As shown in FIG. 1, even a 400 μm thick die the die warpage may be more than 15 μm. The die thickness may also be referred to as its z-height. The x and y directions on the die are in a horizontal plane across the surface of the die. The thickness of a package that includes a die may also be referred to as the package z-height.

The die warpage of a thin die can be reduced in order to enable a standard chip attach process to be used. In embodiments, die warpage is addressed by depositing pre-stressed films on the backside of the die, post wafer thinning, to mitigate die warpage at the reflow temperature during the chip attach process of a thin die. Metallic and non-metallic films may be sputter deposited or electroplated on the silicon backside to compensate for the CTE mismatch between the front end layers and the bulk silicon.

Figure 2:
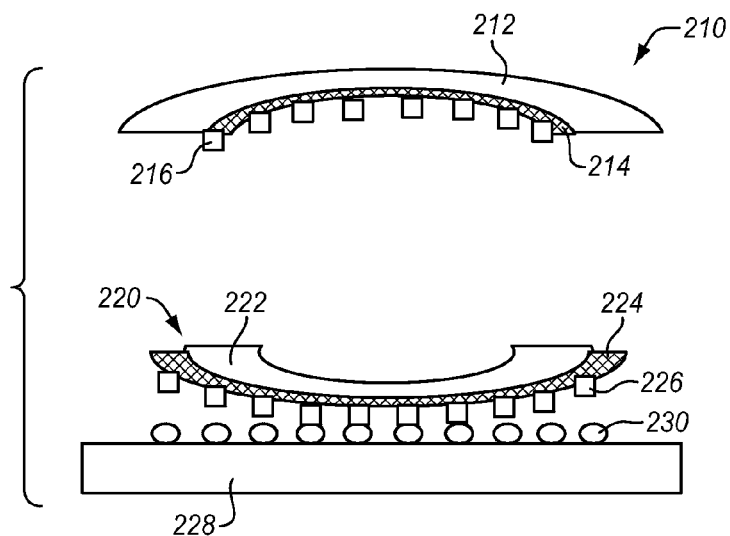
FIG. 2 is a pictorial cross-sectional diagram of die warpage at ambient and chip attach temperatures.

FIG. 2 is a pictorial diagram of die warpage under different circumstances. A die 210 is shown in cross-section. It has a background side 212 of the die's silicon substrate and a front side 214 with front side layers. An array of solder balls 216, lands, pads or some other attachment is attached to the front side layers. The solder balls are to be attached to a package substrate in a reflow furnace or some other type of heating. The intrinsic stress and the CTE mismatch between the front end silicon layers 214 and the bulk silicon 212 leads to die warpage at different temperatures. The die 212 is at room temperature after backgrinding and dicing. At room temperature the die has a convex warpage. While the warpage is shown as a curved line in cross-section, the warpage will also extend in the direction normal to the page. In the illustrated example, the center of the die is further from where the package substrate will attach than the ends of the die. In other words, the solder balls around the periphery of the die are lower than those in the middle.

The second die 220 of FIG. 2 has been heated to a chip attach temperature, for example a solder reflow furnace temperature of about 220° C. or some other temperature higher than room temperature. As the die is heated it warps in the opposite direction so that now the die has a concave warpage. The background side 222 of the die 220 curves upwards around its periphery and away from the front side layers 224. The solder balls 226 in the center of the die will contact a package substrate 228 before those further from the center. With increasing layers in the silicon front end, the die warpage is worse and may significantly impact CAM yield. As shown in FIG. 2, the die 220 curves away from the substrate 228, preventing the die contacts 226 around the periphery from making electrical contact with contacts 230 on the package substrate. Flexible or resilient connection materials 226, 230 may be used to compensate for different differences between the die and the package substrate. However, there are limits to how much warpage can be accommodated.

In embodiments, the die warpage is mitigated by leveraging two different approaches which may be combined, depending on the materials and used and the desired characteristics. In one approach, an adhesive of organic or inorganic material is used to attach a material with a high CTE to the backside of the die. An example described below is depositing a Silicon-Nitride, such as $Si_3N_4$, as an adhesive and then depositing a metallic film such as copper on the backside of the die to compensate for the die warpage at high temperatures.

In the second approach a pre-stressed film which may be metallic or non-metallic is deposited on the backside of the die after the die has been thinned to mitigate die warpage. An example of this approach which is described below is to use TiW at different pre-stress conditions to significantly reduce die warpage. These approaches both reduce warpage significantly to allow chip attach at RF temperature. A high temperature chip attach process is not otherwise possible with a thinned die. Both of these warpage reducing options can be engineered to target any particular chip attach process window.

In one example, silicon-nitride and copper films are deposited on the backside of a silicon die substrate after the substrate is thinned from about 800 μm to less than 200 μm. This reduces the warpage of the thinned die at CAM RF from 90 μm to less than 20 μm. The $Si_3N_4$ pre-stressed film changes the shape of die warpage at room temperature to convex (with bumps at the bottom as shown in FIG. 2) and the copper film modulates the dynamic warpage as the silicon is heated from room temperature to a CAM RF temperature. Different combinations of metallic or non-metallic films can be used to mitigate die warpage.

In another example, a TiW metallic film is used. TiW can be applied at different levels of pre-stress depending on the nature of the die and the die attach process. Using, for example, a 200 μm die with a back side deposited layer of TiW at a stress of −1700 MPa, the warpage at a reflow temperature above 220° C. can be reduced from 50 μm to less than 10 μm. A backside layer with a lower stress, for example −800 MPa still significantly reduces warpage at higher temperatures.

With both types of layers applied to the backside of the die, fewer joint failures occur with solder reflow. The joints between the die and the package substrate are not prevented from forming because of the warpage of the die. While only two types of layers are described as examples other types of layers may be formed instead. Any metal that can easily be deposited and that has an appropriate CTE may be used together with or instead of the Cu and TiW mentioned above. A CTE of 3 ppm/K or more may be suitable for reflow oven temperatures of about 220° C. Other types of inorganic compounds, such as other nitrides, may also be used.

The deposited backside layer may also provide other benefits. For example, a TiW backside metal layer reduces the risk of the die cracking. When the silicon substrate of a die is thinned down, defects induced in the silicon during assembly and test operation may lead to cracking if the die is heated or mechanically stressed. The TiW layer reinforces the die substrate layer and resists the propagation of cracks through the substrate. The layer also resists scratches, impacts, indentations, and bending stresses that may occur in handling. The silicon-nitride and copper layer combination provides similar benefits but to a lesser degree. The protection and reinforcement may prevent a die from cracking.

Figure 3:
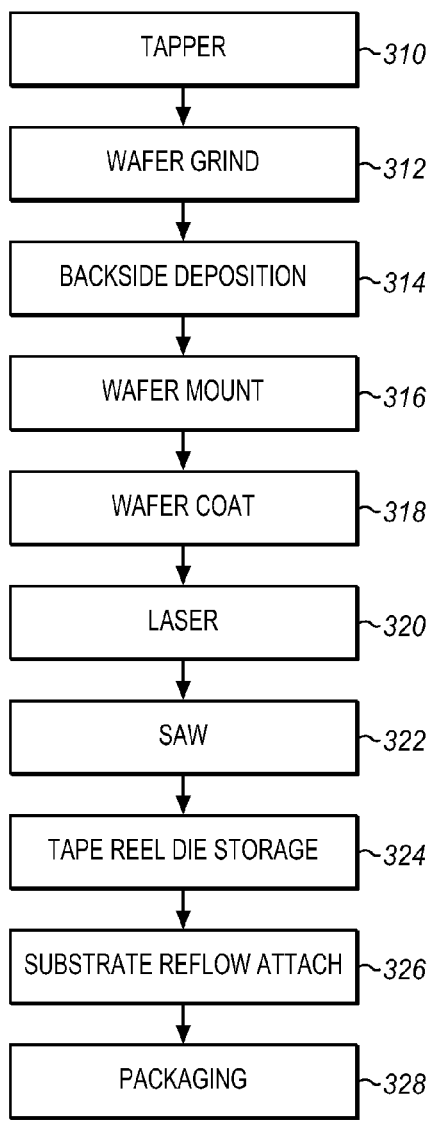
FIG. 3 is a process flow diagram of improving a die using a backside layer according to an embodiment of the invention.

FIG. 3 is a process flow diagram of one example of improving a semiconductor die using a backside layer as described above. While semiconductor dies are discussed herein the described embodiments may be applied to reduce warpage on any of a variety of different micromechanical, optical, and hybrid devices that are formed on a silicon substrate.

At 310, a completed wafer is mounted to a tapper to be reduced to individual dies for packaging. The wafer may contain microelectronic, micromechanical, or optical components, or a combination. The backside of the wafer is ground at 312 to thin the dies. In the examples above, a wafer with a 800 μm substrate is ground down to 100 μm, however the starting and finishing thickness or z-height of the substrate may be adapted to suit different types of wafers and different applications. While a silicon substrate is discussed and described similar techniques may be applied to other substrates, such as gallium arsenide, lithium niobate, and ceramic substrates.

At 314, layers are deposited on the backside of the thinned wafer. The particular layers used may be adapted to suit different design criteria, packaging scenarios, and intended uses for the dies. As described above, a TiW or other metallic layer may be vapor deposited directly onto the wafer backside. Alternatively, silicon nitride or another material may first be deposited as a bonding layer onto the wafer backside. Then, a metallic layer such as copper, TiW or another metallic layer may be deposited onto the bonding layer. The metallic layers may be pre-stressed during deposition with a plasma or other energy source. The backside deposition is described in more detail with respect to FIG. 4.

At 316, the wafer is mounted to a holding tool and at 318, the wafer is coated. At 320, the wafer is marked by laser for sawing and at 322, the wafer is sawn into separate dies. At 324, the separate dies are loaded into tape reel die storage (TRDS). From the tape reel, the dies are then attached at 326 to package substrates through a reflow oven and at 328, the attached dies and substrates are packaged. The packaged dies may later be mounted to any of a variety of different devices for use.

Figure 4:
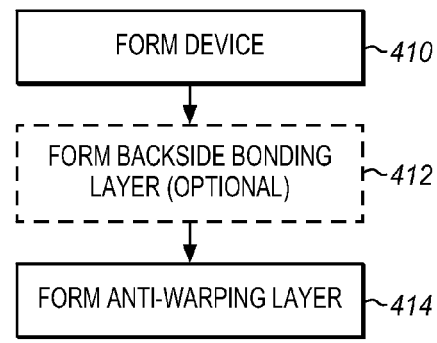
FIG. 4 is a simplified process flow diagram for protecting a die against warpage according to an embodiment of the invention.

FIG. 4 is a simplified process flow diagram for protecting a die against warpage according to one embodiment. At 410 a device, such as but not necessarily a semiconductor wafer, is formed. The device may have a thinned substrate, depending on the particular implementation. At 412 a bonding layer is formed on the backside of the device. The operation is not required and may be adapted to suit the backside substrate material and the anti-warping layer that is to be later applied. In the above example, the bonding layer is silicon nitride and it is applied by chemical vapor deposition. At 414, an anti-warping layer is applied. It is applied directly onto the backside of the substrate by sputtering, chemical vapor deposition or another process. The layer may be a TiW layer or another suitable layer. If operation 412 is used, then the anti-warping layer, for example a Cu layer, is applied over the bonding layer and bonds to the bonding layer. The anti-warping layer may be applied with stress using, for example, a plasma.

Figure 6:
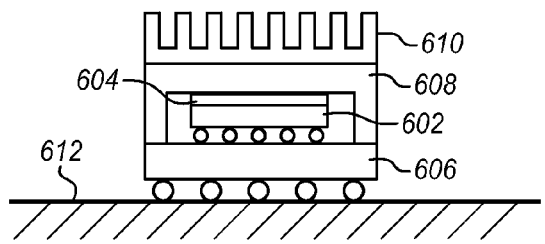
FIG. 6 is a cross-sectional diagram of a package having a package substrate and a die with a thinned backside substrate according to an embodiment of the invention.

FIG. 6 is a cross-sectional diagram of a package having a package substrate and a die with a thinned backside substrate according to one embodiment. The die 602 includes a backside layer 604 to prevent warpage when it is attached to a package substrate 606 under high temperature. The die may be attached using solder balls as shown or in any of a variety of other ways. The die is sealed against the external environment with a cover 608 which is typically plastic or ceramic. In some cases an integrated heat spreader or heat sink 610 is attached to the package cover to cool the die in use.

Figure 5:
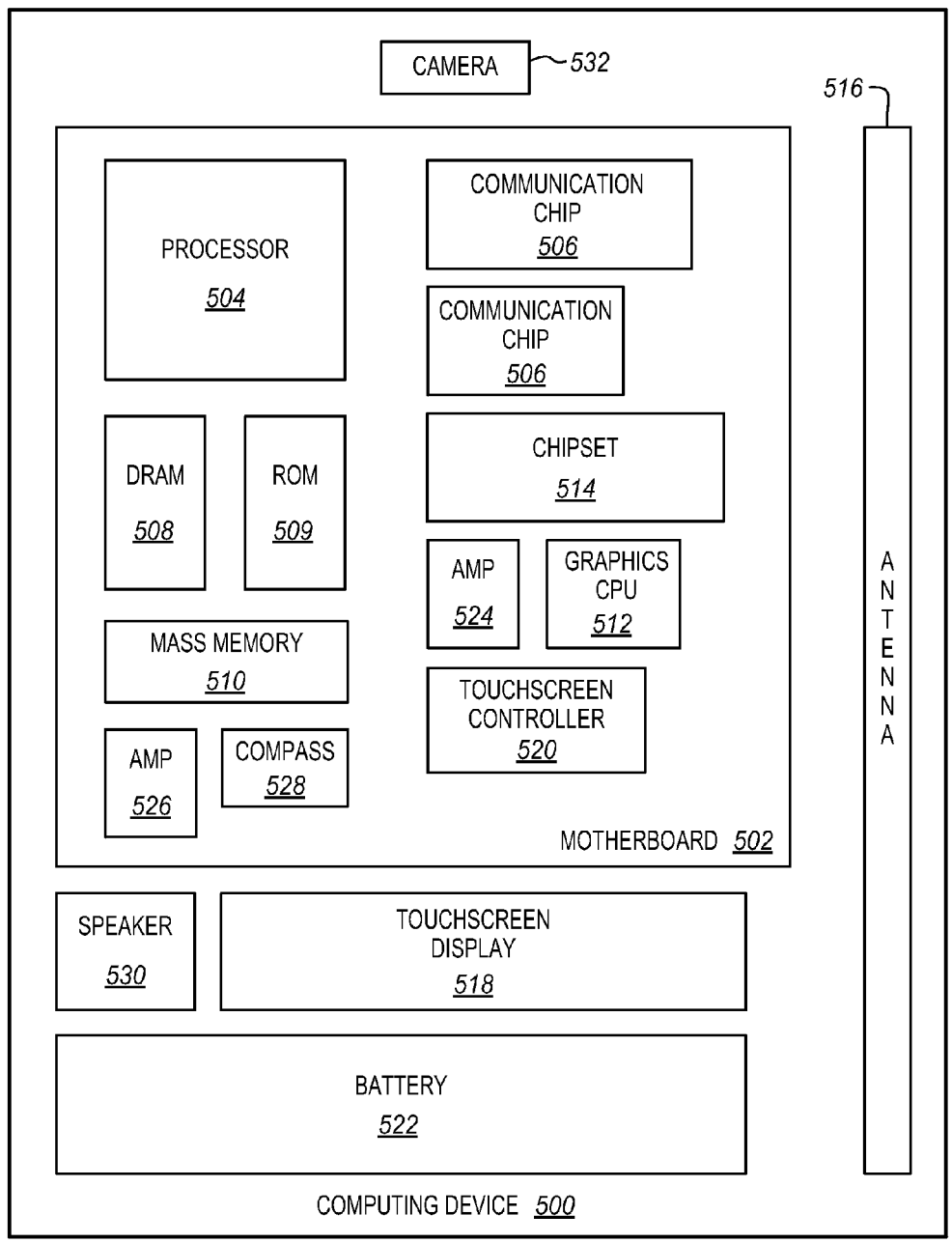
FIG. 5 illustrates a computing device 500 in accordance with an embodiment of the invention.

As packaged between the substrate and the cover, the die may be attached through the substrate to a printed circuit board 612 of a device such as that of FIG. 5 for any of a variety of different uses. The board connects the packaged die to other components for power, input, output, and other interconnections. The package may also have other connections for test or use separate from the board. The substrate translates the solder ball connection points of the die to the solder ball connection points of the printed circuit board. The diagram of FIG. 6 is provided for context to show attachment to a substrate. The approaches described above may be used with a wide variety of different substrate and package designs including flip chip packages. The package may be attached directly to a board or it may be attached to a socket or wire connector, depending on the implementation.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are formed with a backside layer to resist warpage. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method including forming a device having a substrate on a back side and components in front side layers, forming a backside layer over the semiconductor substrate, the layer resisting warpage of the device when the device is heated, and attaching the device to a substrate by heating.

In further embodiments, the substrate has a coefficient of thermal expansion that is different from the front side layers so that the device warps when heated. The substrate is a semiconductor substrate and the components comprise microelectronic circuitry.

Further embodiments include cutting the device from a wafer after forming a layer and before attaching the device. In further embodiments forming a layer comprises forming a bonding layer over the substrate to bond to the substrate and forming a metallic layer over the bonding layer to bond to the bonding layer. The bonding layer may be a silicon nitride. The metallic layer is copper. The metallic layer is TiW.

In further embodiments, forming a layer comprises forming a layer by sputtering, forming a layer comprises forming a pre-stressed layer by applying a plasma to the device during sputtering and the device is attached to a package substrate using a solder reflow oven.

Some embodiments pertain to an apparatus including a die having a substrate on a backside and components in layers on a front side, a layer over the backside to resist warpage of the die when heated, and a plurality of contacts on the front side to attach to a substrate.

In further embodiments, the backside layer comprises a bonding layer bonded to the die substrate and a metallic layer bonded to the bonding layer. The bonding layer is a silicon nitride. The metallic layer is copper. The backside layer is pre-stressed TiW or the die substrate is thinned.

Some embodiments pertain to a semiconductor package with a package substrate, a die attached to the package substrate, the die having a plurality of contacts on a front side to attach to the package substrate and a thinned semiconductor substrate on a backside of the die to carry the contacts, and a layer over the backside to resist warpage of the die when heated. In further embodiments, the front side includes components formed in front side layers and the backside layer is a metallic layer having a coefficient of thermal expansion greater than the coefficient of thermal expansion of the front side layers. In further embodiments the backside layer comprises a bonding layer and a metallic layer.

What is claimed is:

1. An apparatus comprising:
    a semiconductor die having a back side and a front side opposite the back side, the back side having a semiconductor substrate and the front side having components formed over the semiconductor substrate in front side layers that induce a warpage of the die in a particular direction when the die is heated;
    a back side layer over the back side of the semiconductor die to resist warpage of the die in the particular direction when the die is heated, the back side layer having a stress of at least −800 MPa and causing the die to have a warpage opposite the particular direction at room temperature;
    a plurality of contacts on the front side of the die to attach to a substrate; and
    a package substrate soldered to the plurality of contacts.

2. The apparatus of claim 1, wherein the semiconductor substrate has a coefficient of thermal expansion that is different from the front side layers to induce the warpage when heated.

3. The apparatus of claim 1, wherein the components of the front side layers comprise microelectronic circuitry.

4. The apparatus of claim 1, wherein the semiconductor substrate and front side layers are cut from a silicon wafer.

5. The apparatus of claim 1, wherein the back side layer comprises a pre-stressed deposition bonding layer over the back side of the semiconductor substrate, the apparatus further comprising a metallic deposition layer over the bonding layer.

6. The apparatus of claim 5, wherein the bonding layer is bonded to the die substrate and wherein the back side metallic layer is bonded to the bonding layer.

7. The apparatus of claim 6, wherein the bonding layer is a silicon nitride.

8. The apparatus of claim 6, wherein the metallic layer is copper.

9. The apparatus of claim 1, wherein the back side layer is pre-stressed TiW.

10. The apparatus of claim 1, wherein the back side layer is a sputtered pre-stressed layer.

11. The apparatus of claim 1, wherein the back side layer is a pre-stressed silicon nitride film over the semiconductor substrate, the apparatus further comprising an additional back side layer over the silicon nitride film.

12. The apparatus of claim 1, wherein the semiconductor substrate is thinned.

13. The apparatus of claim 1, wherein the front side layers induce a warpage of less than 20 μm in the die when the die is heated to a reflow temperature of 220° C. due to the back side layer.

14. A semiconductor package comprising:
    a package substrate;
    a semiconductor die attached to the package substrate, the die having a plurality of contacts on a front side to attach to the package substrate and a thinned semiconductor substrate on a back side of the die to carry the contacts, the front side being opposite the back side, the back side having a semiconductor substrate and the front side having components formed over the semiconductor substrate in front side layers that are connected to the contacts and that induce a warpage of the die in a articular direction when the die is heated; and
    a back side layer over the back side of the semiconductor die to resist warpage of the die in the particular direction when the die is heated, the back side layer having a stress of at least −800 MPa and causing the die to have a warpage opposite the particular direction at room temperature.

15. The package of claim 14, wherein the back side layer is a metallic layer having a coefficient of thermal expansion greater than the coefficient of thermal expansion of the front side layers.

16. The package of claim 14, wherein the back side layer comprises a bonding layer, the package further comprising a metallic layer deposited over the bonding layer.

17. The package of claim 16, wherein the bonding layer is a silicon nitride.

18. The package of claim 16, wherein the metallic layer is copper.

19. The package of claim 16, wherein the back side layer is pre-stressed TiW.

20. The package of claim 14, wherein the back side layer is a sputtered pre-stressed layer.

* * * * *